United States Patent

Tsuno et al.

(10) Patent No.: US 8,586,920 B2
(45) Date of Patent: Nov. 19, 2013

(54) CHARGED PARTICLE BEAM APPARATUS

(75) Inventors: Natsuki Tsuno, Saitama (JP); Hiroshi Makino, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 285 days.

(21) Appl. No.: 13/126,198

(22) PCT Filed: Oct. 28, 2009

(86) PCT No.: PCT/JP2009/005694
§ 371 (c)(1),
(2), (4) Date: Apr. 27, 2011

(87) PCT Pub. No.: WO2010/052854
PCT Pub. Date: May 14, 2010

(65) Prior Publication Data
US 2011/0204228 A1  Aug. 25, 2011

(30) Foreign Application Priority Data
Nov. 5, 2008 (JP) .................................. 2008-284554

(51) Int. Cl.
*H01J 37/28* (2006.01)
(52) U.S. Cl.
CPC ..................................... *H01J 37/28* (2013.01)
USPC ........................................................ 250/310
(58) Field of Classification Search
USPC ........................................ 250/310; 356/237.4
See application file for complete search history.

(56) References Cited

U.S. PATENT DOCUMENTS

| | | | |
|---|---|---|---|
| 6,753,524 B2 * | 6/2004 | Matsui et al. | 850/9 |
| 7,601,954 B2 * | 10/2009 | Nishiyama et al. | 250/310 |
| 7,612,321 B2 * | 11/2009 | Tsao | 250/208.3 |
| 2003/0094572 A1 | 5/2003 | Matsui et al. | |
| 2004/0227077 A1 | 11/2004 | Takagi et al. | |
| 2007/0058164 A1 | 3/2007 | Shibata et al. | |

FOREIGN PATENT DOCUMENTS

| | | |
|---|---|---|
| JP | 57-98840 A | 6/1982 |
| JP | 2000-340160 A | 12/2000 |
| JP | 2003-151483 A | 5/2003 |
| JP | 2007-71804 A | 3/2007 |

* cited by examiner

*Primary Examiner* — Kiet T Nguyen
(74) *Attorney, Agent, or Firm* — Mattingly & Malur, PC

(57) ABSTRACT

It has been difficult to obtain pattern contrast required for inspecting a specific layer of a circuit pattern in a charged particle beam apparatus which inspects, by using a charged particle beam, the position and type of a defect on a wafer having a circuit pattern which is in semiconductor manufacturing process. At the time of inspecting the position and type of a defect on a wafer having a circuit pattern which is in semiconductor manufacturing process by using a charged particle beam emitted from a charged particle source (11), the wafer arranged on a holder (20) is irradiated with light in wavelength ranges different from each other from a light irradiation system (9), and at the same time, the wafer is irradiated with a charged particle beam. Thus, contrast of an image is improved and inspection is performed with high sensitivity.

19 Claims, 9 Drawing Sheets

(a) (b)

CHARGED PARTICLE BEAM APPARATUS

TECHNICAL FIELD

The present invention relates to technologies concerning a charged particle beam apparatus using a charged particle beam, and in particular, to an inspection technology for detecting abnormality in pattern shape of a semiconductor wafer substrate, and an electrical defect of a device, in a semiconductor inspection apparatus using a charged particle beam.

BACKGROUND ART

As further advances have been made in progress toward higher integration of a semiconductor device, a device structure has undergone further miniaturization, and has turned more multilayered, thereby rendering the structure more complex. In order to enhance yield in a process for manufacturing the semiconductor device, there is the need for a technology for detecting an electrical defect such as a conduction deficiency, and so forth, directly connected with a semiconductor device deficiency, with high sensitivity. Defects of which detection is required have since undergone diversification to include an exposure pattern deficiency in a resist pattern, conduction deficiency of a contact hole, deficient embedding of a plug, alignment deficiency at the time of stacking, and so forth. There is available a defect inspection technology making use of an electron beam, capable of meeting the need in the process for manufacturing the semiconductor device. With the defect inspection technology, when electron beams are caused to converge, and scan over a semiconductor wafer, secondary electrons emitted from the wafer are detected to thereby acquire a secondary electron image of a circuit pattern. For detection of a normal part, and a defect part, advantage is taken of electrostatic charging of a semiconductor wafer, occurring when the semiconductor wafer is irradiated with the electron beams. Because there occurs a difference in an amount of static charge between the normal part, and the defect part, and a detection amount of the secondary electrons undergoes a change, a contrast between the normal part, and the defect part can be obtained. This contrast is called a defect contrast.

As a method for achieving enhancement of the defect contrast, thereby performing inspection with high sensitivity, there haven been known various methods including a method whereby a voltage is applied to an electrode for controlling static charge, provided on a semiconductor wafer, to thereby control polarity of the static charge, and an amount of the static charge by use of secondary electrons occurring when the semiconductor wafer is irradiated with electron beams, and a method whereby a wafer is electrostatically charged in advance by use of an electron source capable of irradiating a large area at a large current, and thereafter, inspection is performed by use of electron beams for the purpose of the inspection. For example, in the case where a surface of a wafer is positively charged, secondary electrons emitted from the bottom of an open contact hole are drawn out by positive static charge of the surface. The open contact hole in the normal part will turn brighter than an insulating film on the periphery of the open contact hole, so that a pattern contrast can be formed.

On the other hand, in the defect part where a portion of the insulating film is left out at the bottom of the open contact hole, the insulating film at the bottom thereof, as well, is positively charged as is the case with the surface of the wafer, so that an electric field drawn out from the bottom will be weakened. A non-open contact hole will be as bright as the insulating film on the periphery of the non-open contact hole, and a difference in brightness between the normal part, and the defect is the defect contrast.

Meanwhile, as a method for achieving enhancement of the defect contrast by use of a static charge control technology without the use of an electron beam, there has been known Japanese Patent Application Laid-Open Publication No. 2003-151483 (Patent Document 1). In the case of inspecting non-conduction deficiency of a plug in a semiconductor wafer including a transistor such as a CMOS, and so forth, a junction part formed between a p-type semiconductor, and an n-type semiconductor, incorporated in the semiconductor wafer, will pose a problem. With the method for controlling static charge by use of an electron beam, an amount of the static charge will undergo a change according to a resistance value of a device, so that it has been necessary to change over the polarity of a voltage to be applied to an electrode for controlling static charge according to the type of junction, thereby obtaining a pattern contrast. Furthermore, there has existed another problem that variation in resistance value at a junction will lead to variation in pattern contrast of the plug, thereby resulting in deterioration of the defect contrast.

In Patent Document 1, there is shown a method whereby resistance at a junction is lowered by irradiating a junction layer with ultraviolet light to thereby enhance a pattern contrast. The ultraviolet light makes use of a wavelength transmitting through an insulating film to be absorbed by Si. The ultraviolet light for irradiation transmits through the insulating film formed on the wafer to reach an Si-layer. As the ultraviolet light absorbed by the Si-layer creates electron and hole in pairs at a junction part to thereby render the unction par electrically conductive, resistance is lowered. Since resistance at junction is negligible, it is possible to obtain a uniform pattern contrast regardless of the type of a junction. Furthermore, since variation is negligible due to reduction in resistance at the junction part, the pattern contrast is stabilized, and therefore, a defect inspection with high sensitivity can be performed.

RELATED ART DOCUMENT

Patent Document

Patent Document 1: Japanese Patent Application Laid-Open Publication No. 2003-151483

DISCLOSURE OF THE INVENTION

Problems to be Solved by the Invention

In order to obtain a high defect contrast in a wafer comprised of a plurality of layers, it is important to obtain a high pattern contrast in a layer including a defect. However, the following problem has existed with a conventional semiconductor inspection method making use of an electron beam.

As shown in FIG. 8A, with the method for controlling static charge by use of electron beams 102, static charge cannot be generated except for on the surface of a wafer. In FIG. 8A, there is shown a sectional view depicting a specimen including a three-layer structure in which a contact hole is formed, the figure depicting a state in which the surface of the three-layer structure is irradiated with electrons by the electron beams 102, whereupon the surface of the three-layer structure is electrostatically charged by the action of secondary electrons emitted from respective layers. Thus, with the method for controlling static charge by use of the electron beams 102, a substantially uniform field intensity {field intensity proportional to the slope of a graph shown in a figure (b) of FIG. 8A} is formed in a range from the bottom of a hole to the surface of the wafer. The figure (b) of FIG. 8A is a view showing a relationship between depthwise directions of respective portions of a specimen, in the depthwise directions, and potentials thereof, in a state where the bottom layer of the specimen is grounded, and the topmost layer thereof is electrostatically charged at 10V. An amount of signals from the hole is dependent on a field intensity distribution occurring in the longitudinal direction of the hole, and if the specimen has a uniform field intensity distribution in the range of the hole bottom to the surface of the wafer, the secondary electrons can be uniformly obtained from the respective layers, so that a pattern contrast between the respective layers has been low, rendering it difficult to extract the pattern contrast of a specific intermediate layer only. More specifically, as shown in (c) of FIG. 8A, depicting a secondary electron image that is obtained by observing the contact hole from the top surface of the specimen, a pattern contrast between an intermediate layer 104, and a bottom layer 105 is low, so that it has been difficult to clearly identify them. For this reason, although there has evidently occurred a defect attributable to misalignment in view of the fact that an alignment defect indicated at 106, where only one length of two lengths of parallel lines, each of the parallel lines, representing a boundary between the intermediate layer 104, and the bottom layer 105, as seen in the other holes, comes into view, it has been difficult to determine occurrence of the defect because of a low pattern contrast. A figure (a) of FIG. 8A is a sectional view taken on a solid line A-A' in the figure (c) of FIG. 8A.

In the case of obtaining the pattern contrast of a specific layer, it is important to control an static charge distribution from the specific layer to the surface of the specimen to thereby increase electric field intensity from the specific layer to a surface layer. In the case of inspecting a alignment deficiency of an intermediate layer, for example, sidewalls of a gate of a wafer where contact holes are formed, it is important to control an static charge distribution from a sidewall layer to the top surface of the contact hole. In the case of attaining enhancement of a pattern contrast by taking advantage of electrical conduction effected with the use of ultraviolet irradiation, it is possible to render only the sidewall layer electrically conductive to thereby inhibit occurrence of static charge, however, a sufficient pattern contrast cannot be obtained by means of electrical conduction alone. In order to detect misalignment of the sidewall having a small exposed region, in particular, it is important to have a high pattern contrast. For example, in the case of a technology for taking advantage of electrical conduction effected with the use of the ultraviolet irradiation, the specimen is irradiated with light 62 transmitting through an upper layer surrounding a hole to be absorbed by an intermediate layer, as shown in a figure (a) of FIG. 8C, and only a sidewall layer as the intermediate layer is rendered electrically conductive, thereby enabling the occurrence of static charge to be inhibited.

By so doing, electric field intensity can be rendered substantially at zero by lowering resistance of the sidewall layer, as shown in a figure (b) of FIG. 8C. In so doing, while electric field intensity from a sidewall layer whose pattern contrast need be enhanced to the top surface of the contact hole can be rendered larger than that in the conventional case (refer to (b) of FIG. 8A), field strength from the sidewall layer to the surface of the hole can be rendered smaller than that in the conventional case (refer to the figure (b) of FIG. 8A). As a result, while secondary electrons emitted from the sidewall layer will be susceptible to be drawn out toward a detector, secondary electrons emitted from the surface of the hole will be insusceptible to be drawn out toward the detector, so that a pattern contrast is presumably turned higher than that in the conventional case. However, although with the adoption of the technology for rendering the intermediate layer electrically conductive by use of the ultraviolet irradiation, improvement on the pattern contrast can be hoped for as compared with the conventional case, a problem has remained in that it is very difficult to make defect determination because a sufficient pattern contrast cannot be obtained as yet.

It is therefore an object of the invention to solve the problems described as above, and to provide a charged particle beam apparatus capable of rapidly and stably control static charge of a specimen having various structures, thereby detecting a specific defect with high sensitivity.

Means for Solving the Problems

The invention provides representative apparatuses given hereunder. One representative apparatus is a charged particle beam apparatus comprising a charged particle gun, a specimen holder with a specimen placed thereon, a charged particle optical system for irradiating the specimen placed on the specimen holder with charged particle beams irradiated from the charged particle gun, a detector for detecting secondary electrons generated by irradiation of the specimen with the charged particle beams, an image processing unit for executing image processing of signals of the secondary electrons detected by the detector, and a photoirradiation system capable of simultaneously irradiating an identical region of the specimen placed on the specimen holder with light of a first wavelength band, and light of a second wavelength band, differing in wavelength band from each other.

Further, another representative apparatus is a charged particle beam apparatus comprising a charged particle gun, a specimen holder with a specimen placed thereon, a charged particle optical system for irradiating the specimen placed on the specimen holder with charged particle beams irradiated from the charged particle gun, a detector for detecting secondary electrons generated by irradiation of the specimen with the charged particle beams, an image processing unit for executing image processing of signals of the secondary electrons detected by the detector, and a photoirradiation system for irradiating the specimen placed on the specimen holder with light, wherein the photoirradiation system comprises a beam splitter for integrating respective optical paths of light of a first wavelength band, and light of a the second wavelength band, differing in wavelength band from each other.

Further, still another representative apparatus is a charged particle beam apparatus for inspection of a specimen having a structure comprised of third, second, and first layers that are stacked on top of each other in orderly sequence, said charged particle beam apparatus comprising a charged particle gun, a specimen holder with the specimen placed thereon, a photoirradiation system for simultaneously irradiating light of a first wavelength band to be absorbed by the first layer, and light of a second wavelength band transmitting through the first layer, and the second layer to be absorbed by the third layer, a charged particle optical system for causing the first layer positively charged due to irradiation with the light of the first wavelength band, and the second layer negatively charged by the agency of photo electrons, the photo electrons being generated in the third layer due to irradiation thereof with the light of the second wavelength band, to be irradiated with charged particle beams irradiated from the charged particle gun, a detector for detecting secondary electrons generated by irradiation of the first layer and the second layer with the charged particle beams, and an image processing unit for executing image processing of signals of the secondary electrons detected by the detector.

Effects of the Invention

With the invention, it is possible to carry out irradiation with a plurality of wavelengths, thereby realizing enhancement in pattern contrast. As a result of the enhancement in pattern contrast, the invention can provide the apparatus capable of executing observation, measurement, and inspection by use of the charged particle beams with high precision, and high sensitivity

BEST MODE FOR CARRYING OUT THE INVENTION

Embodiments of the invention are described hereinafter with reference to the accompanying drawings. This description is applicable to a charged particle beam apparatus in general, however, for convenience of description, an electron beam apparatus using an electron as one of a charged particle is described. To understand the charged particle beam apparatus, it need only be sufficient to substitute a charged particle for the electron. Further, the charged particle other than the electron includes, for example, an ion, and the invention can be applied to an ion beam apparatus using ions, as well. In the present description, a wavelength is meant by a wavelength at the peak of intensity distribution in light output intensity distribution, and a wavelength band is meant by a wavelength range with an output corresponding to not less than 1/e of the peak output obtained by standardization of the light output intensity distribution.

First Embodiment

Figure 1:
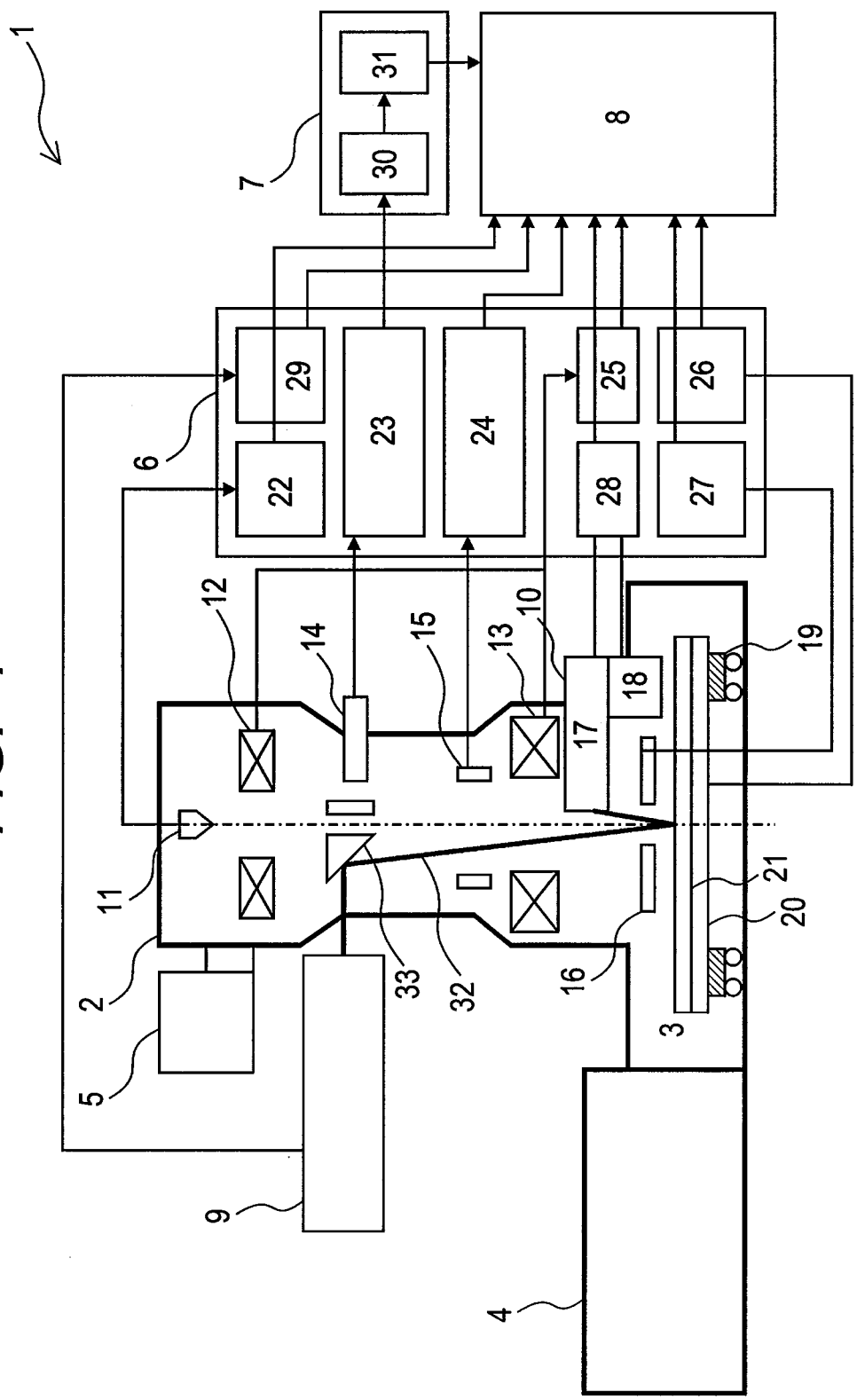
FIG. 1 is a block diagram showing one example of a semiconductor inspection apparatus according to the invention.

With a first embodiment of the invention, there is described an example in which the alignment deficiency of an intermediate layer is detected in the case where a hole-pattern is formed on a wafer for inspection, as a specimen, in an electron beam apparatus (a charged particle beam apparatus). FIG. 1 shows a configuration of an electron beam apparatus 1 according to the present embodiment by way of example. The electron beam apparatus 1 is comprised of an electronic optical system 2, a stage mechanism system 3, a wafer transfer system 4, a vacuum pumping system 5, a control system 6, an image processing system 7, an operator panel 8, a photoirradiation system 9, and a photoirradiation condition measurement system 10. The electronic optical system 2 is comprised of an electron gun 11, a condenser lens 12, an objective lens 13, a detector 14, a deflector 15, and an electrode 16 over a wafer. The photoirradiation condition measurement system 10 is comprised of an absorptivity meter 17, and a surface electrometer 18. The stage mechanism system 3 is comprised of an X-Y stage 19, a wafer holder (a specimen holder) 20, and a wafer 21. The control system 6 is comprised of a beam controller 22, a detection system controller 23, a deflection controller 24, an electronic lens-controller 25, a retarding voltage controller 26, an electrode controller 27, a photoirradiation condition measurement controller 28, and a photoirradiation controller 29. The image processing system 7 is comprised of an image processor 30 and an image memory 21.

Figure 2:
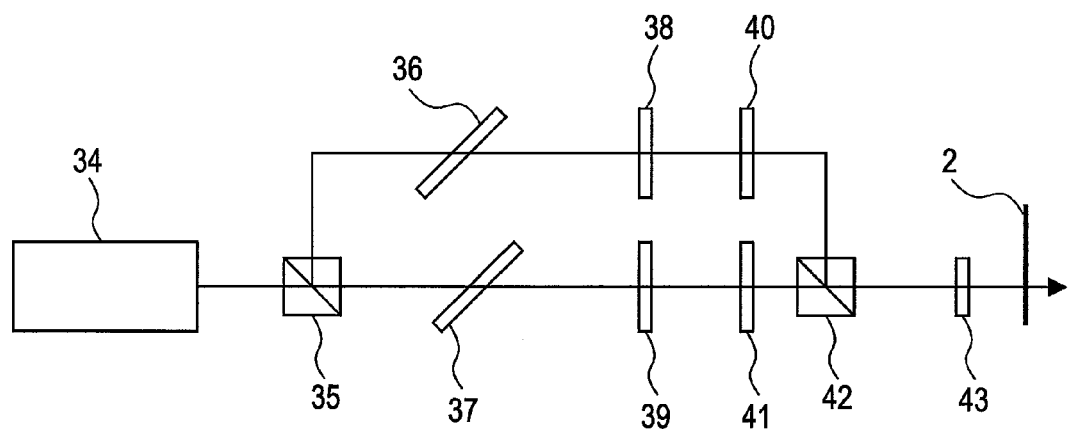
FIG. 2 is a block diagram showing one example of a photoirradiation system according to the invention.

With the present embodiment, at the same time when light 32 guided into a vacuum inside an enclosure covering up the electronic optical system 2 is irradiated to the wafer 21 which is a specimen as an inspection object, an electron beam is irradiated to the wafer 21, thereby performing a defect inspection on the basis of a secondary electron image as detected. A configuration example of the photoirradiation system 9 is shown in FIG. 2. For a light source 34, use has been made of a light source containing wavelengths in a range of 133 to 1064 nm. For the light source 34, use can be made of a mercury lamp, an excimer lamp, a tunable laser, and so forth. Light emitted from the light source 34 is divided into two light beams when the optical path of the light is split into two lengths of the optical paths by a beam splitter 35. The light beams as split can be controlled by changing respective wavelength bands with the use of wavelength selection filters 36, 37, disposed in the respective optical paths.

For the filter, use has been made of an etalon filter. The etalon filter is a common filter capable of selecting a wavelength according to an angle at which a light beam falling on a filter. These filters are capable of individually and independently controlling an angle for an incident light beam, and setting a wavelength band for every divided light beam by control from the photoirradiation controller 29. Further, for the wavelength selection filters 36, 37, use is made of the etalon filter adopting a configuration wherein a wavelength selection range is changed by varying a range of wavelength selection. With the present embodiment, use is made of the etalon filter, however, use can be made of a combination of the wavelength selection filters, or a spectroscopic element, and the filter is not limited to the case of the present embodiment. Elements 38, 39 for controlling energy of light are disposed in respective optical paths, and as a control element of these elements, use has been made of a continuous type ND (Neutral Density) filter. The continuous type ND filter is a filter for causing transmittance to change according to a position of irradiation light, being capable of controlling energy by moving a position of the filter. Furthermore, use can be made of not only the continuous type ND filter, but also a revolver type ND filter. With the present embodiment, use ha been made of the ND filter, however, use can be made of an attenuator, and a wedge plate without being limited by the case of the present embodiment.

Further, as shown in FIG. 2, the shutters 40, 41 for shielding the light beam, respectively, are disposed in the respective optical paths of the light beams. Irradiation time of the light beam passing through the respective optical paths, and the presence or absence of irradiation can be controlled by opening/closing of the respective shutters 40, 41. As a device for controlling the irradiation time, use can be made of an optical chopper. These wavelength selection filters, the light energy control elements, and the shutters each can be independently controlled from the photoirradiation controller 29. The light beams that are individually subjected to condition setting are consolidated in one optical path by a beam splitter 42, and a beam shape of the irradiation light can be controlled by one operation by use of a beam-shape control element 43. With the present embodiment, for the beam-shape control element 43, use has been made of microlens array. The beam shape can be optionally set irrespective of an electron-beam scanning region. Other beam-shape control elements include a down-collimating optical system by a mirror lens, and so forth. With the present embodiment, the beam-shape control element is not limited to the microlens array, and the down-collimating optical system, in particular. Thus, the photoirradiation system 9 is configured such that the optical path of light emitted from a single light source is split into two optical paths by the agency of the beam splitter 35, and after respective wavelength bands of light beams as split, energy, and the presence or absence of irradiation are controlled, the optical paths are integrated into one optical path by the beam splitter 42, whereupon the light as the light 32 can be irradiated to an inspection specimen (the wafer) disposed in the vacuum.

Figure 3:
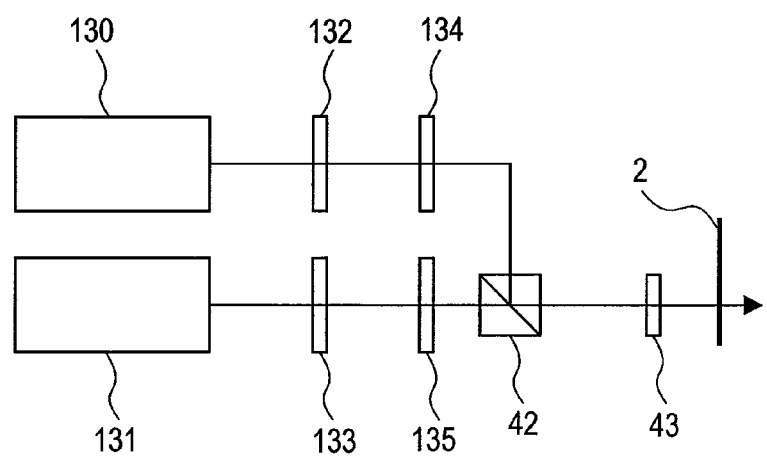
FIG. 3 is a block diagram showing another example of a photoirradiation system according to the invention.

Now, FIG. 3 shows a configuration example of a photoirradiation system 9 differing from the one shown in FIG. 2. The photoirradiation system 9 is configured such that two types of light sources 130, 131 (for example, a halogen lamp, a mercury lamp, and so forth), differing in output wavelength region from each other, are prepared unlike the case of the single light source shown in FIG. 2, and two optical paths are formed without a light beam going through the beam splitter 35, the two optical paths individually including energy control elements 132, 133, and shutters 134, 135, respectively. Configurations, and roles of the respective shutters 134, 135 as well as the respective energy control elements 132, 133 have been described with reference to FIG. 2, omitting therefore description thereof. Further, in the case of using a laser beam at a light source, there are available a system of making use of higher order wavelength conversion, and a system of making use of parametric oscillation.
Furthermore, use may be made of a configuration wherein one type of light sources 130, 131, respectively, are provided, and the wavelength selection filters 36, 37 in the same way as shown in FIG. 2.

Next, there is described hereinafter a way in which the light as consolidated is guided in the vacuum before reaching the inspection. The light 32 is guided into the vacuum by taking advantage of a vacuum window of quartz, $MgF_2$, and so forth, having high transmittance up to an ultraviolet region. The light 32 guided into the vacuum can be caused to fall toward the wafer in such a way as to be substantially coaxial with the electronic optical system by the agency of a reflecting plate 33 installed on the optical axis of the electronic optical system 2. The reflecting plate 33 is made up by applying a coating high in reflectance, such as an aluminum coating, or a dielectric multilayer. With the present embodiment, there is adopted an optical system for causing light to vertically fall down, however, it is also possible to adopt a configuration wherein the wafer is irradiated in a slanting direction from the under surface of an objective lens, control of an irradiation angle, by use of a mirror, and scanning by use of a galvanometer mirror. The absorptivity meter 17 for measuring absorptivity of each of respective constituent layers of the wafer is configured so as to be able to measure an amplitude, and a polarizing angle of light when irradiation light is reflected by the wafer. Based on the principle of electroscopic ellipsometry, it is possible to work out absorption coefficient from results of measurement on the amplitude, and the polarizing angle. As a means for measuring the amplitude of light on a wavelength-by-wavelength basis, use can be made of a spectroscope, and the polarizing angle can be measured by use of a polarizer. For the surface electrometer 18, use is made of a noncontact type surface electrometer.

The absorptivity meter 17 is not an essential constituent of the present apparatus, and there are conceivable, for example, the case where absorption coefficient is known because it has already been measured outside the apparatus, and the case where absorption coefficient is empirically found depending on a process condition. In such a case, there is no need for taking the trouble to find absorption coefficient in the vacuum inside an inspection apparatus, so that the absorptivity meter 17 can be removed from the configuration of the apparatus. Further, with the photoirradiation system 9, there is shown an example in which the beam splitter 42 for integrating the optical paths into the one optical path is provided as shown in FIGS. 2, 3.

However, it is to be pointed out that this photoirradiation system shows nothing but a preferable structure as one embodiment of the invention and that various changes in configuration can be made. For example, it is possible to do without the beam splitter 42. It is possible to adopt a configuration wherein use is made of light sources differing from each other, and respective light beams emitted therefrom are caused to fall toward a wafer form respective directions. More specifically, it need only be sufficient to have a photoirradiation system capable of causing the predetermined and identical region on the surface of a wafer to be simultaneously irradiated with light beams differing in wavelength band from each other, and optical paths need not be consolidated before irradiation in a vacuum. However, the configuration wherein the optical paths are consolidated has an advantage over a configuration wherein the optical paths are not consolidated in that photoirradiation control can be executed with ease, and higher precision because there is no need for independently controlling the irradiation region, and the beam-shape control element Now, there is described hereinafter a method for detecting a defect, using the electron beam apparatus 1 shown in FIG. 1, with reference to an inspection flow.

Figure 5:
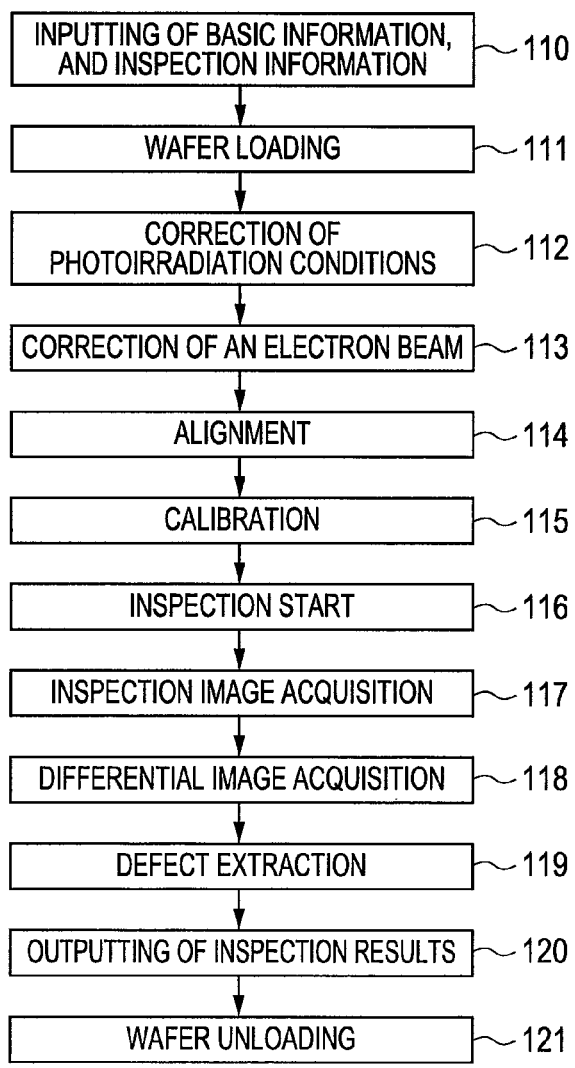
FIG. 5 is a block diagram showing an inspection flow according to the invention.

FIG. 5 shows the inspection flow. Basic information on a wafer, and inspection information, prepared, and registered beforehand, are inputted from the operator panel 8. The basic information on the wafer includes a layout pattern, and so forth, and the inspection information includes an inspection region, an inspection condition, and a photoirradiation condition. The inspection condition includes an irradiation electron-beam current, an incident energy, a scanning rate, and a scan size. The photoirradiation condition includes a wavelength, an irradiation energy, an irradiation pulse, an irradiation region, absorptivity of material as an inspection object, and so forth (step S110). After the basic information on the wafer, and the inspection information (the inspection condition setting) are inputted, the wafer 21 is guided to a reserve specimen chamber (not shown) by the wafer transfer system 4 to be subjected to vacuum pumping before being guided to an inspection chamber (step S111). After loading of the wafer 21, the photoirradiation condition is set by the photoirradiation controller 29 on the basis of the photoirradiation condition as the inspection information that is inputted in the step S110 (step S112).

After the photoirradiation condition is set, an electron-beam irradiation condition is set on the basis of the inspection condition that is inputted in the step S110. At the time of this setting, a pattern for correction of an electron beam is used to thereby correct the focal point of the electron beam, astigmatism, and so forth, as well (step S113). After correction of the electron beam, a wafer position is detected to thereby execute alignment of the wafer position with a rotation amount (step S114). After the alignment, adjustment of brightness and contrast of a secondary electron image that is acquired by the detector 14 while the light beam is irradiated by opening the shutters 40, 41 inside the photoirradiation system 9, so-called calibration is executed (step S115). After completion of the calibration, inspection is started on the basis of the inspection region (step S116), whereupon the shutters 40, 41, inside the photoirradiation system 9, are opened, and the secondary electron image emitted from the region irradiated with the light beam by stage transfer while the light beam is irradiated is acquired as an inspection image (step S117). By the agency of the image processing system 7, a secondary electron image is acquired from each of two identical pattern layout units in regions differing from each other, and one of both the secondary electron images is taken as a reference image corresponding to a normal part, while the other is taken as an inspection image, thereby conducting image-comparison inspection to acquire a differential image of the respective images (step S118).

Further, both the images need not be secondary electron images, and CAD data may be used as the reference image to thereby acquire a differential image. A defect position is extracted from abnormal lightness (step S119), and inspection results are outputted (step S120). More specifically, if a differential signal of the differential image is not less than a given value, it is determined that a defect exists at the position of the differential signal while the differential signal is less than the given value, it is determined that a defect does not exist. Thus, the presence or absence of a defect is determined on the basis of the value of the differential signal of the differential image, that is, on the basis of abnormal lightness, whereupon such determination is outputted as the inspection results. After completion of the inspection, the wafer 21 is unloaded by the wafer transfer system 4, thereby completing the inspection flow (step S121).

Figure 6:
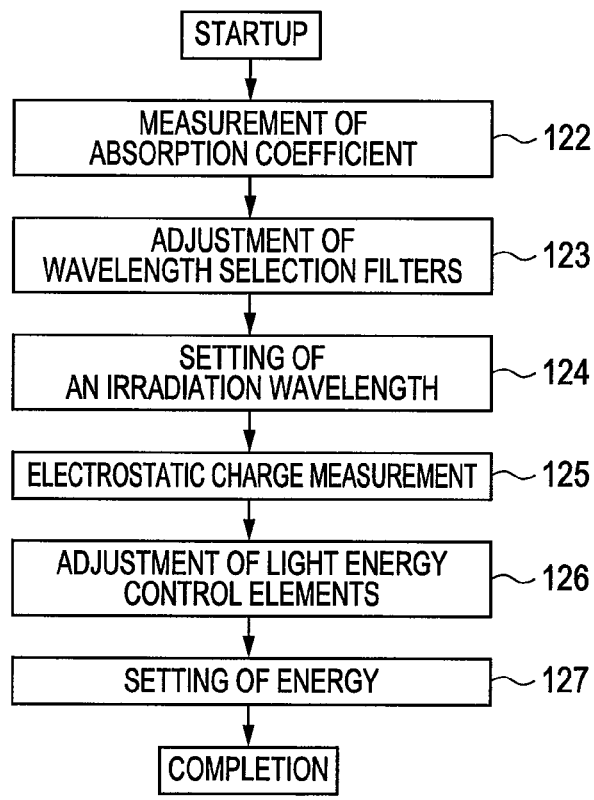
FIG. 6 is a block diagram showing one example of a flow for setting a photoirradiation condition according to the invention.

Next, a detailed flow for setting the photoirradiation condition (the step S112), as a point of the present invention, is described hereinafter with reference to FIG. 6. First, the wafer is irradiated with the light 32, and absorptivity (absorption coefficient) is measured by the absorptivity meter 17 (step S122). Respective filter angles of the wavelength selection filters 36, 37 are varied according to a signal from the photoirradiation controller 29 such that absorptivity will be not higher than the absorptivity set under an photoirradiation condition, and wavelength bands of the respective light beams for irradiation are adjusted (step S123), thereby setting an irradiation wavelength (step S124). For correction of the irradiation energy, a surface potential of the photoirradiation region is measured by the surface electrometer 18 (step S125), and the elements 38, 39 for controlling energy of light are rotated by the photoirradiation controller 29 so as to meet the surface potential as set under the photoirradiation condition, thereby adjusting and setting the irradiation energy (steps S126, S127). Further, adjustment of the photoirradiation region as well is made by a series of the steps of the flow. Thereafter, the irradiation condition of the electron beam is set (the step S113). Further, as described in the foregoing, if the absorptivity of the material as the inspection object is already known, measurement of absorptivity can be omitted. By virtue of the flow described as above, it is possible to control the respective members of the photoirradiation system 9 through the intermediary of the photoirradiation controller 29 to thereby set the wavelength band of light, the irradiation energy, and the irradiation region, suitable to a wafer as the inspection object. Furthermore, the presence or absence of the light beams differing in wavelength band from each other, and the irradiation time thereof can also be set by controlling the respective shutters 40, 41 of the photoirradiation controller 29.

Figure 7:
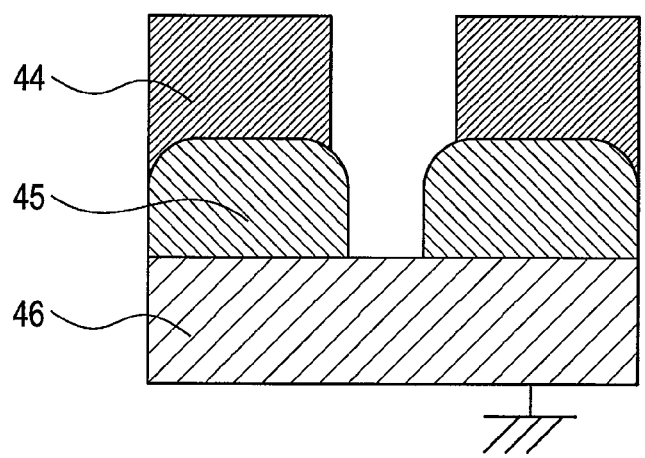
FIG. 7 is a schematic representation showing one example of a layered structure of an inspection object.

Next, there are described hereinafter a method for setting the photoirradiation condition when detecting alignment deficiency of an intermediate layer with the use of the electron beam apparatus according to the present embodiment, a method for inspection, and the principle behind enhancement in pattern contrast. FIG. 7 shows a layered structure of a wafer as the specimen. The wafer has a three-layer structure comprised of a surface layer 44, an intermediate layer 45, and a bottom layer 46. For example, the surface layer 44 is made of $SiO_2$, the intermediate layer 45 is made of $Si_3N_4$, and the bottom layer 46 is made of Si. FIG. 7 is a sectional view of the wafer when a contact hole is formed after $SiO_2$ is selectively etched by use a resist pattern with a pattern of the contact hole formed on the surface layer 44 of $SiO_2$ as a mask, and further, the intermediate layer 45 of $Si_3N_4$ is selectively etched. This shows the well-known layered structure for use when providing contact with the diffusion layer of a transistor of a memory cell of a DRAM, in particular. In this case, the contact hole is formed by selective etching such that a hole diameter of the intermediate layer 45 of $Si_3N_4$ is smaller than that of the surface layer 44 of $SiO_2$, and therefore, the hole diameter of the intermediate layer 45 of $Si_3N_4$ in the figure is depicted as smaller than that of the surface layer 44 of $SiO_2$.

Figure 8A:
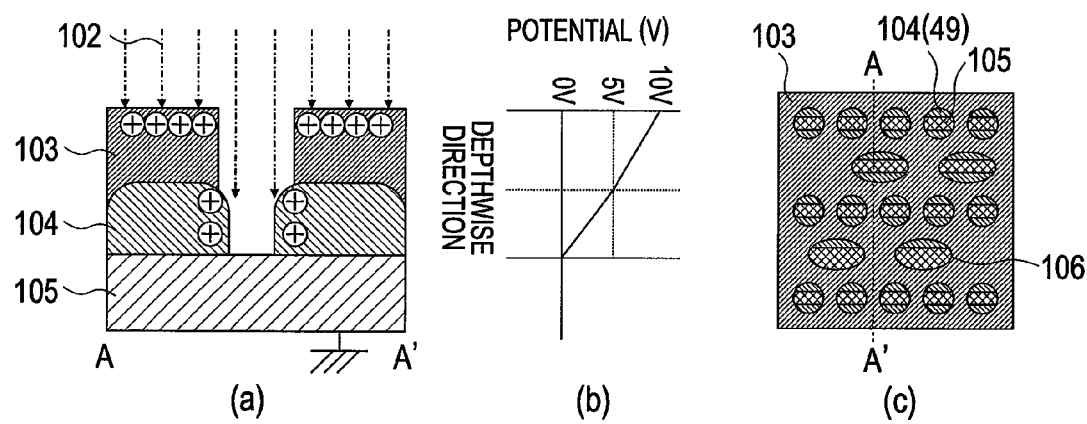
FIG. 8A is a schematic representation showing a conventional technology.

In FIG. 8A, there is shown potential distribution {refer to (b) of FIG. 8A} on the hole axis when the surface of a specimen is irradiated with the electron beams 102, thereby causing the surface of the specimen to be electrostatically charged, and the secondary electron image as acquired {refer to (c) of FIG. 8A}. In the case of static buildup, since static charge is built up on the surface of material, a potential gradient from the intermediate layer 104 to a surface layer 103 is gentle, and electric field intensity is low. Accordingly, contrast of a region 49 showing a portion of the intermediate layer, inside the hole, is low in the secondary electron image, so that pattern recognition is difficult. Meanwhile, in FIG. 8B, there are shown schematic diagrams depicting a specimen in section when irradiation is executed with light having a plurality of wavelength bands by use of the charged particle beam apparatus according to the invention, potential distribution {refer to (b) of FIG. 8B} on the hole axis, and a secondary electron image as acquired {refer to (c) of FIG. 8B}, respectively.

Figure 8B:
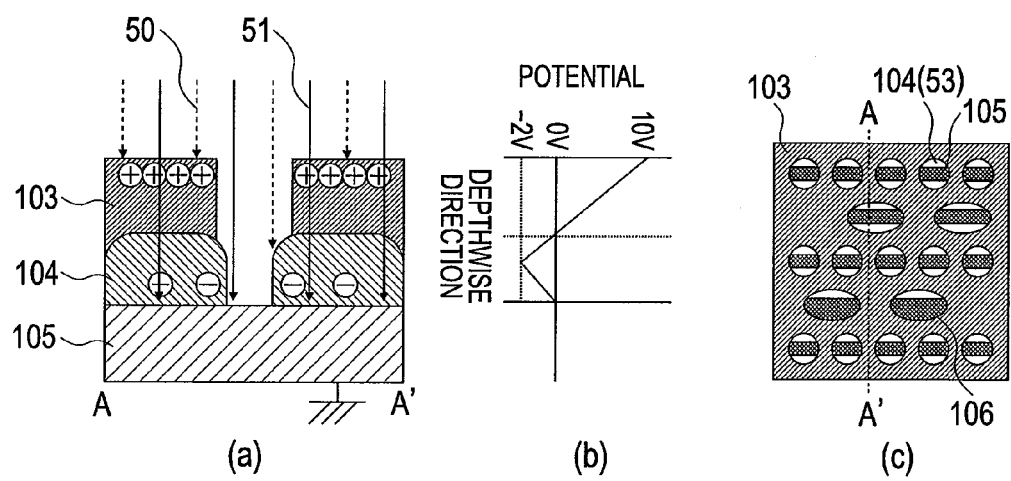
FIG. 8B is a schematic representation showing an advantageous effect of the invention by way of example.
Figure 8C:
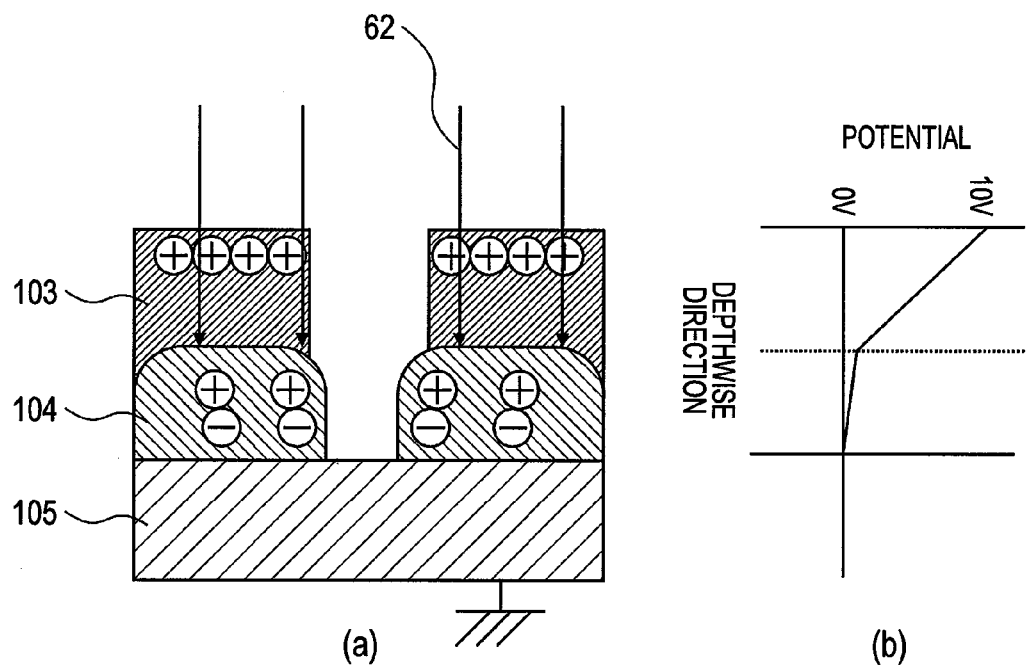
FIG. 8C is a schematic representation showing an advantageous effect of a technology under study by way of example.

As schematically shown in (a) of FIG. 8B, a specimen is irradiated with light 50 of a first wavelength band including a wavelength to be absorbed by a surface layer 103, and light 51 of a second wavelength band differing from the first wavelength band, having a wavelength transmitting through the surface layer 103, and an intermediate layer 104 to be absorbed by a bottom layer 105. Upon the light of the first wavelength band being absorbed by the surface layer 103, positive static charge occurs to the surface layer 103 while upon the light of the second wavelength band being absorbed by the bottom layer 105, photo electrons are emitted from the bottom layer 105, and injection of the photo electrons into the intermediate layer 104 causes the intermediate layer 104 to have negative static charge. These positive static charge, and negative static charge are generated due to a phenomenon in which the photo electrons are emitted from the surface layer 103 into a vacuum by the agency of energy of the light 50 of the first wavelength band, for irradiation, and a phenomenon in which the photo electrons are emitted from the bottom layer 105 to be injected into the intermediate layer 104 by the agency of energy of the light 51 of the second wavelength band, for irradiation. In (b) of FIG. 8B, there is shown a relationship between depthwise direction of the specimen, and static potential in the case where such phenomena occur, and the surface layer 103 has positive static charge while the intermediate layer 104 has negative static charge. In the figure, there is shown the relationship when the surface of the surface layer 103 is positively charged at 10V. As shown in the figure, since the intermediate layer 104 is negatively charged, potential at a specific spot in the layer will be more negative as compared with the bottom layer 105 (for example, −2V). Accordingly, a potential gradient from the intermediate layer 104 to the surface layer 103 will be steeper than a conventional potential gradient, so that the electric field intensity can be rendered higher than that in the past.

Further. along with this, a potential gradient from the bottom layer 105 to the intermediate layer 104 can be rendered inclined in the opposite direction, thereby causing the electric field to be oriented in the opposite direction. If such a potential distribution as described is developed, secondary electrons emitted due to the intermediate layer 104 being irradiated with electron beams for inspection will be drawn out toward the detector while gathering momentum by the agency of a high electric field intensity. At the same time, secondary electrons emitted due to the bottom layer 105 being irradiated with electron beams for inspection will be pulled back to the bottom layer 105 by the agency of a negative electric field to become harder to be drawn out. Hence, in a secondary electron image shown in (c) of FIG. 8B, contrast between a region 104 showing an intermediate layer inside a hole, and a region 105 showing a bottom layer inside the hole will be higher, so that a defect part 106 having an alignment deficiency can be recognized with greater ease as compared with the case of the secondary electron image according to the conventional technology. As a result, it will be possible to detect a defect in the intermediate layer with high sensitivity.

With the conventional method for generating static charge by irradiation with electron beams, there exists another problem that an mount of static charge on the surface of a wafer undergoes a change due to irradiation with electron beams for inspection, thereby rendering it difficult to stabilize contrast. However, with the apparatus according to the invention, it is possible to concurrently irradiate a region as an inspection object with the light of the first wavelength band, and the light of the second wavelength band even during irradiation with the electron beams, so that the positive static charge and the negative static charge can be stabilized in terms of charge amount. For this reason, the apparatus according to the invention has an advantage over the conventional method for generating static charge by irradiation with electron beams in that an image contrast ca be more stabilized.

Figure 9:
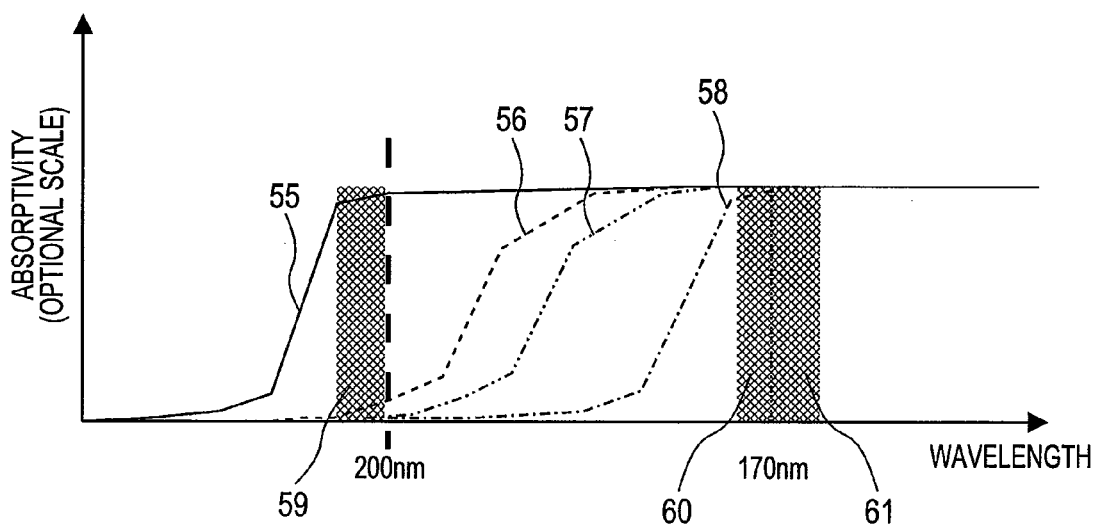
FIG. 9 is a schematic representation showing a method for determining an irradiation wavelength according to an absorptivity curve.

Further, with the photoirradiation system of the apparatus according to the invention, it is possible to execute inspection of the surface layer 103 by changing over the presence or absence of irradiation with the light of the first wavelength band, and the light of the second wavelength band by use of the shutters 40, 41, respectively, thereby causing the surface layer 103 to be positively charged by the light of the first wavelength band, and it is possible to execute inspection of the intermediate layer 104 by concurrent irradiation with the light of the first wavelength band, and the light of the second wavelength band, in which case, it is possible to execute inspection of respective defects in different layers with the use of the present apparatus by changing over the presence or absence of irradiation on the basis of, for example, design data of a device Next, there is described hereinafter a method for setting the photoirradiation condition. For example, the surface layer 103 is made of $SiO_2$, the intermediate layer 104 is made of $Si_3N_4$, and the bottom layer 105 is made of Si. Based on the composition of the present embodiment, absorptivity was measured by use of the absorptivity meter 17. FIG. 9 shows measurement results including an Si absorptivity curve 55, an $Si_3N_4$, absorptivity curve 56, an $SiO_2$ absorptivity curve 57, by the CVD method, and an $SiO_2$ absorptivity curve 58, by thermal oxidation. The vertical axis indicates standardized absorptivity on an optional scale, and the horizontal axis indicates wavelength. In the figure, it is shown that the higher absorptivity is, the more susceptible to absorption is light having a specific wavelength.

Now, the horizontal axis is an axis along which a wavelength varies in an ascending order as it moves leftward. While the measurement results show that light absorptivity is dependent on a wavelength in accordance with the type of material, it has been found that light absorptivity is dependent on a wavelength in accordance with a film-forming method even if identical materials are used. In the case of the surface layer 103 being formed by the CVD method, the light of the first wavelength band selects a wavelength band 60 in a wavelength range of 170 to 180 nm, and in the case of the surface layer 103 being formed by the thermal oxidation, the light of the first wavelength band selects a wavelength band 61 in a wavelength range of 133 to 170 nm. The light of the second wavelength band that is absorbed by the bottom layer 105 selects a wavelength band 59 in a wavelength range of 200 to 220 nm. A wavelength band is decided according to a relationship between wavelength and absorptivity.

More specifically, the light of the first wavelength band selects a wavelength band susceptible to absorption by the surface layer 103, having a high absorptivity, and the light of the second wavelength band selects a wavelength band insusceptible to absorption by (susceptible to transmission to) the surface layer 103, and the intermediate layer 104, having a low absorptivity, and susceptible to absorption by the bottom layer 105, having a high absorptivity. Now, absorptivity measurement, and measurement results have been described, however, with the present apparatus absorptivity need not be measured as previously described. If a relationship between absorptivity of each of the layers, and wavelength, or a combination of wavelength bands, suitable to the present inspection, is known, the first wavelength band, and the second wavelength band can be decided by use of the known information Herein, there is described hereinafter the setting of the irradiation energy for the respective wavelength bands, made in the step S126. The light of the first wavelength band only is irradiated, and irradiation energy is adjusted so as to reach a target static potential while measuring the surface potential by use of the surface electrometer 18. Thereafter, the light of the second wavelength band is irradiated, and irradiation energy of the light of the second wavelength band is adjusted such that a pattern contrast of a layer to be detected will be larger than a given value or at the maximum. Thus, by making adjustments in two steps, that is, adjustment of the irradiation energy of the light of the second wavelength band after adjustment of the irradiation energy of the light of the first wavelength band, it is possible to adjust the irradiation energy of light so as to be able to obtain an optimum pattern contrast while setting the surface potential at a target value.

It has been described in the foregoing that the specimen as the inspection object has the layered structure comprised of the surface layer 44 of $SiO_2$, the intermediate layer 45 of $Si_3N_4$, and the bottom layer 46 of Si, however, since the layered structure is adaptable to a specimen having a layered structure of an optional combination of layers, the photoirradiation system 9 is structured so as to enable a combination of the first wavelength and the second wavelength to be changed in order to cope with an optional layered structure. Further, since absorptivity undergoes a change according to the film-forming method of a layer, film thickness thereof, and so forth, the photoirradiation system 9 is structured so as to enable the combination of the first wavelength and the second wavelength to be changed. Still further, since a pattern contrast is dependent on the irradiation energy of the respective lights, the photoirradiation system 9 is structured so as to enable the irradiation energy of the respective lights to be independently set. However, in connection with a combination of the wavelength bands, in the case of executing an inspection on a specimen having a specific layered structure, or a structure suitable for a specific film-forming method, the combination of the wavelength bands, adaptable to the layered structure, can be pre-fixed instead of providing a structure capable of changing the combination of the wavelength bands.

More specifically, if it is known that the surface layer 44 is made of $SiO_2$, the intermediate layer 45 is made of $Si_3N_4$, and the bottom layer 46 is made of Si, it need only be sufficient to adopt a combination of light of a predetermined wavelength band of a wavelength band in a wavelength range of 133 to 180 nm, as the first wavelength band, and light of a predetermined wavelength band of a wavelength band in a wavelength range of 200 to 320 nm, as the second wavelength band. Further, in the present description, a wavelength range having the peak wavelength in a range of 100 to 1064 nm is presumed as a range of light wavelengths in consideration of the material for use in a semiconductor, and if light of a wavelength band in the range described as above can be outputted by the present apparatus, it is possible to obtain an advantageous effect of the invention even if a stacked film is formed of layers made of various materials.

Figure 4:
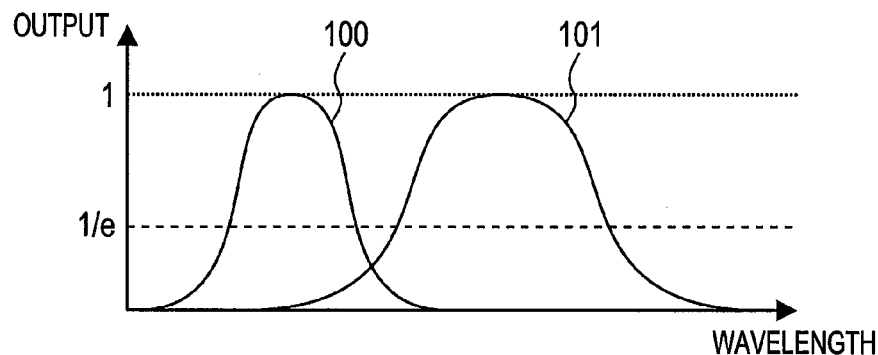
FIG. 4 is a schematic representation showing one example of wavelength bands for irradiation.

Herein, the first wavelength band, and the second wavelength band, mentioned in the present description, are described with reference to FIG. 4. The light 100 of the first wavelength band, and the light 101 of the second wavelength band each are light including a plurality of wavelengths, long and short, centering around the peak wavelength, as shown in FIG. 4. In this case, use can be made of light of a broad wavelength band with a wavelength width in a range of several of tens to several of hundreds nm, and light of a wavelength band with a narrow wavelength width in a range of several to several of tens nm, such as a laser beam. In the present description, the numerical value of a wavelength band is declared, the wavelength band refers to a wavelength band with an output in the range not less than 1/e of the standardized peak output. Further, in the present description, light beams differing in wavelength band from each other refer to light beams having an output not less than 1/e, respectively, and not overlapping each other.

That is, wavelengths with an output less than 1/e, and overlapping each other may exist, as shown in FIG. 4. This is because the output less than 1/e does not contribute to electrostatic charging of most of the layers. On the other hand, light beams having the output not less than 1/e, respectively, and overlapping each other are, in effect, regarded as light of a single wavelength band, and a phenomenon of electrical conduction between the surface layer to be positively charged, and the intermediate layer to be negatively charged occurs, thereby raising a possibility that potentials of the respective layers will be substantially identical to each other. In this case, a desirable pattern contrast cannot be obtained and it is therefore necessary to select the irradiation energy of the light having an output not less than 1/e, respectively, and not overlapping each other, and the wavelength bands thereof.

With the charged particle beam apparatus described in the foregoing, it has since become possible to dramatically improve on detection of a defective contrast out of a pattern contrast of a specific layer. As a result, the charged particle beam apparatus can now contribute to yield management, and early detection of deficiency, in a semiconductor manufacturing process.

Second Embodiment

Figure 10:
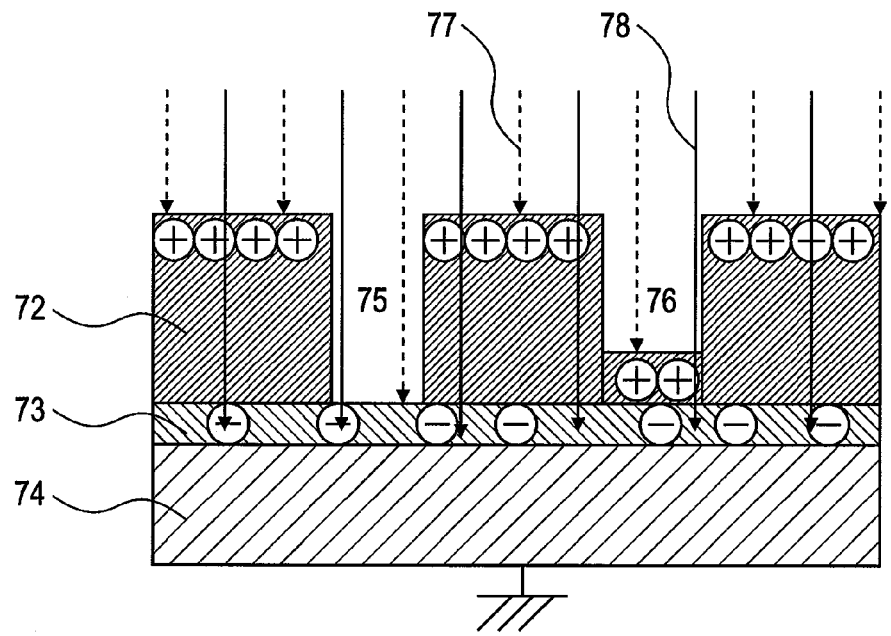
FIG. 10 is a schematic representation showing an effect of the layered structure of one example of an inspection object.

With a second embodiment of the invention, there is described an inspection of a specimen as an inspection object, differing from the specimen according to the first embodiment, by use of the apparatus described in the first embodiment. FIG. 10 shows a layered structure of a wafer as the inspection object. The wafer has a three-layer structure comprised of a surface layer 72, an intermediate layer 73, and a bottom layer 74. The surface layer 72 is a resist film, the intermediate layer 73 an anti-reflection film (BARC), and the bottom layer 74 a film made of Si. The specimen differs from the specimen according to the first embodiment in that the intermediate layer 73 has no opening. In the first embodiment, an inspection of an alignment defect is described, however, with the second embodiment, there is shown an example adapted to an inspection of an opening deficiency. A normal part is in as opened-state exposing a portion of the BARC layer, and a defect part includes a portion of the resist film, left out, indicating a state of an opening deficiency. Upon common irradiation with electron beams, the resist layer and the BARC layer, each being an insulating layer, are similarly electrostatically charged. Accordingly, the bottom of a hole in the defect part as well as the normal part will be electrostatically charged. In the case of an inspection on an opening deficiency, a difference in lightness between the normal part, and the defect part is obtained according to the presence or absence of static charge at the bottom of the hole, so that a secondary electron image obtained only by the method for controlling static charge by use of the electron beam will hardly have a difference in lightness, and it has been difficult to detect a defect contrast.

Accordingly, if use is made of light 77 of the first wavelength band described in the first embodiment, and light 78 of the second wavelength band described in the first embodiment, it is possible to enhance a defect contrast against the opening deficiency. The light 77 of the first wavelength band selects light of a wavelength band susceptible to absorption by the surface layer 72, and the light 78 of the second wavelength band selects light of a wavelength band insusceptible to absorption by (susceptible to transmission to) the surface layer 72, and the intermediate layer 73, and susceptible to absorption by the bottom layer 74. By selecting the lights of the respective wavelength band, the surface layer 72 can be positively charged while the intermediate layer 73 can be negatively charged. With the conventional technology, both the normal part, and the defect part are positively charged, and therefore, it has been difficult to obtain the defect contrast. On the other hand, with the technology making use of the present apparatus, since the normal part can be positively charged, and the defect part can be negatively charged, electric field intensity inside the hole of the normal part will be greater than that in the conventional case. In consequence, secondary electrons from the normal part will be susceptible to be drawn out toward the detector, so that contrast between the normal part and the defect part is enhanced, and a defect of the opening deficiency can be detected with high precision.

Third Embodiment

Figure 13:
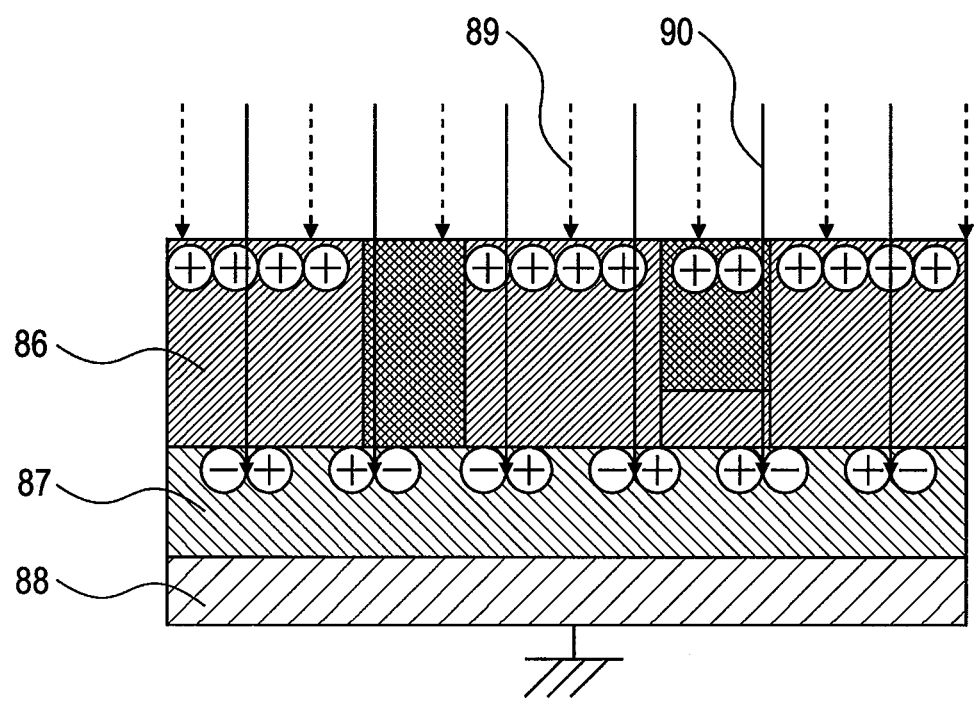
FIG. 13 is a schematic representation showing another example of a layered structure of an inspection object.

With a third embodiment of the invention, there is described an inspection of a specimen as an inspection object, differing from the specimens according to the first embodiment, and the second embodiment, respectively, by use of the apparatus described in the case of the first embodiment. FIG. 13 shows a layered structure of a wafer as the inspection object. The wafer has a three-layer structure comprised of a surface layer 86, an intermediate layer 87, and a bottom layer 88. The surface layer 86 is made of $SiO_2$, the intermediate layer 87 is a diffusion (junction) layer, and the bottom layer 88 is made of Si. The specimen according to the present embodiment differs from the specimens according to the first embodiment, and the second embodiment, respectively, in that the intermediate (junction) layer 87 is a diffusion layer, and a plug is not embedded in a contact hole. With the first embodiment, the inspection of the alignment defect is described, and with the second embodiment, the inspection of the opening deficiency is described. With the third embodiment, however, there is shown an example adapted to detection of plug-short deficiency of a wafer in which a plug pattern is formed. A normal part is a plug portion embedded in a portion of the surface layer 86, on the left side in FIG. 13, wherein a plug is electrically connected with the intermediate layer 87. On the other hand, a defect part is a plug portion embedded in a portion of the surface layer 86, on the right side in FIG. 13, wherein a plug is embedded in a contact hole with an opening deficiency, and is therefore not electrically connected with the intermediate layer 87.

In a typical plug inspection, since a normal plug is electrically connected with a conduction film, the normal plug is as-grounded state via the conduction film, so that charge is not built up in the plug, and the plug is therefore not electrostatically charged. On the other hand, if there exists a short circuit, and void in a plug, the plug is in as-ungrounded state, and charge is built up in the plug, and the plug is therefore electrostatically charged. For this reason, when irradiation is carried out with electron beams for inspection, a detection amount of secondary electrons emitted from the surface of the plug will vary owing to a difference in charge amount between static charge in the plug, and the absence of static charge in the plug, so that brightness contrast between the normal part and the defect part can be obtained.

However, in the case where a plug is connected with the intermediate layer 87 that is the diffusion layer, as shown in FIG. 13, the plug will be in a state where it is not electrically connected due to pn junction between the bottom layer 88, and the intermediate layer 87. Accordingly, charge is built up in the plug even in the normal part, and a secondary electron image generated by the method for controlling static charge by use of the electron beam, alone, will hardly have brightness contrast, so that it has been difficult to obtain a defect contrast. Accordingly, with the use of light 89 of the first wavelength band of the apparatus described in the first embodiment, and light 90 of the second wavelength band of the apparatus described in the first embodiment against the plug-short deficiency, it is possible to enhance the defect contrast. The light 89 of the first wavelength band selects light of a wavelength band susceptible to absorption by the surface layer 86, and the light 90 of the second wavelength band selects light of a wavelength band insusceptible to absorption by (susceptible to transmission to) the surface layer 86, and susceptible to absorption by intermediate layer 87. By selecting the lights of the respective wavelength band, photo electrons are emitted from the surface layer, thereby enabling the surface to be positively charged, and further, by use of the light 90 of the second wavelength band, the intermediate layer 87 as a junction part can be rendered conductive. At this point in time, simultaneously with the intermediate layer 87 being turned conductive, electrons from the intermediate layer 87 are caused to flow into the plug to act as a normal part, whereupon mitigation in static charge of the plug at the normal part is effected.

On the other hand, as for static charge of a plug at the defect part, the electrons are insusceptible to flow owing to deficiency, so that the plug is insusceptible to mitigation in static charge. For this reason, when irradiation is carried out with electron beams for inspection, a detection amount of the secondary electrons emitted from the surface of the plug will vary, and brightness contrast between the normal part and the defect part can be obtained, so that contrast between the normal part and the defect part is enhanced, and a defect such as the plug-short deficiency, and so forth can be detected with high precision.

Next, there is described hereinafter energy adjustment of the light 89 of the first wavelength band, and the light 90 of the second wavelength band. With the third embodiment, the energy of the light 90 of the second wavelength band is first adjusted, thereby adjusting energy for rendering the junction layer appropriately conductive. In rendering the junction layer conductive, an electric current that is caused to flow due to the junction layer being rendered conductive is measured by use of an ammeter mounted in the retarding voltage controller 26, thereby determining whether or not the energy is appropriate. Subsequently, irradiation with the light 89 of the first wavelength band is executed while executing irradiation with the light 90 of the second wavelength band as adjusted, thereby executing adjustment of energy of the light 89 of the first wavelength band such that a pattern contrast is turned higher than a given value or at a maximum value.

By irradiating a wafer including a plug structure with a plurality of lights differing in action from each other in accordance with a method described as above, it has become possible to enhance the defect contrast. As a result, the method can now contribute to yield management, and early detection of deficiency, in the semiconductor manufacturing process.

Fourth Embodiment

Figure 11:
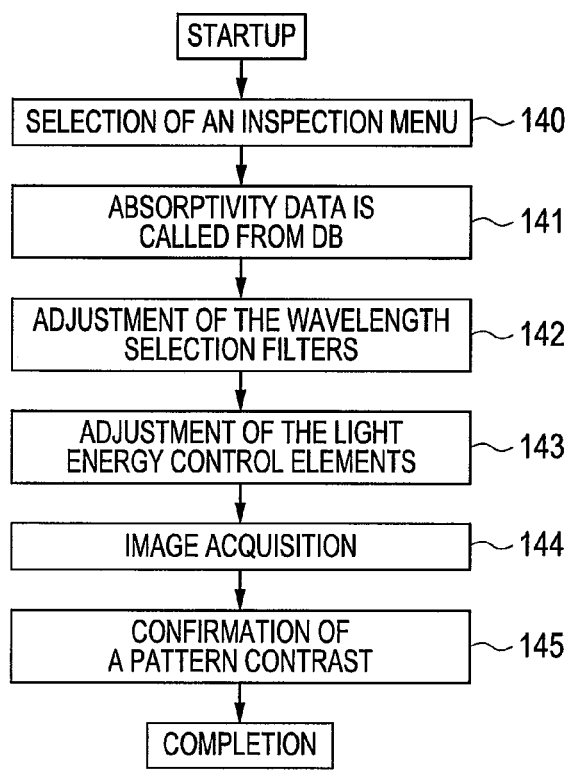
FIG. 11 is a block diagram showing a flow for determining an irradiation condition by use of a database.
Figure 12:
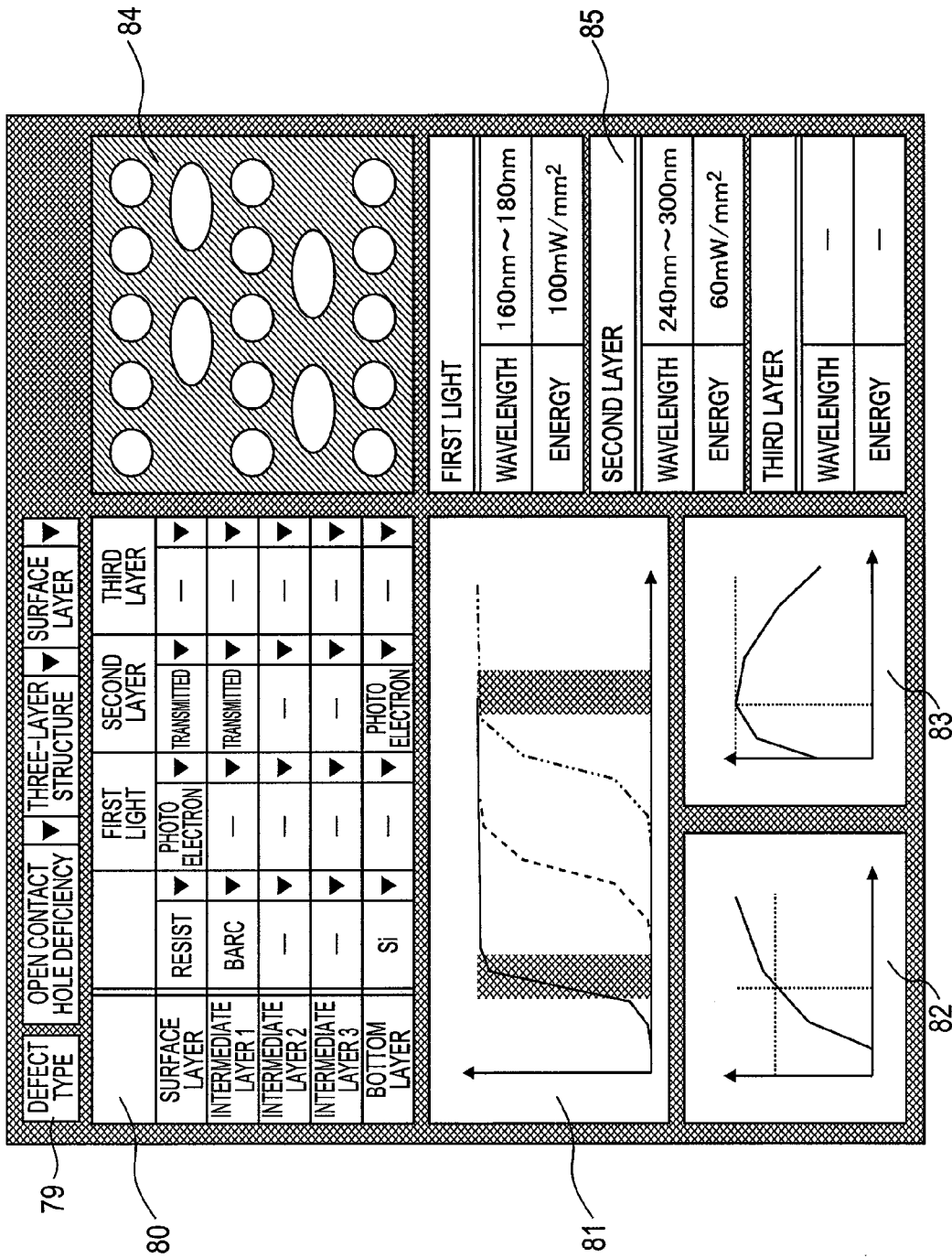
FIG. 12 is a block diagram showing a GUI for setting a photoirradiation condition.

With a fourth embodiment, there is described hereinafter a means for selecting a wavelength band of light for irradiation in the apparatus described in the case of the first embodiment. With the present embodiment, there is described a selection flow for irradiation light in the case where information on absorptivity of material, on a layer-by-layer basis, is prestored in a database instead of particularly using the absorptivity meter 17. With the use of the database, it is possible to acquire a secondary electron image having a high contrast on the basis of the information accumulated in the database by controlling the photoirradiation system 9 without measuring absorptivity of light in the predetermined materials, one by one, when acquiring the secondary electron image. FIG. 11 shows the selection flow. Further, FIG. 12 shows a GUI (Graphical User Interface) registered in a workstation that is mounted in the operator panel 8. With a window 79 for setting a defect type, shown in FIG. 12, defect types for inspection can be inputted therein. The defect types include, for example, an opening deficiency, an alignment deficiency, and so forth. Further, the layered structure of a specimen for inspection can be inputted therein. The layered structures include, for example, a three-layer structure, a four-layer structure, and so forth. Further, a layer as inspection object can be inputted therein. The inspection objects include, for example, a surface layer, an intermediate layer, and so forth. Thus, the defect types for inspection, and the layers as the inspection object can be set therein. Furthermore, layered structures, and induced phenomena, in accordance with defect types, and processes, respectively, are registered, to be automatically called up on a window 80 for setting a layered structure (step S140). In the window, "photo electron" indicates absorption of light, in a layer corresponding thereto, while "transmitted" indicates transmission of light, in a layer corresponding thereto. Then, absorptivity data is called from the database connected with the apparatus beforehand, wherein absorptivity on a material-by-material basis is registered (step S141), thereby varying the respective filter angles of the wavelength selection filters 36, 37 according to signals from the photoirradiation controller 29 (step S142). For energy adjustment, an irradiation dose is worked out on the basis of quantum efficiency registered in the database, and an irradiation area of each wavelength band, and the elements 38, 39 for controlling energy of light are rotated by the agency of the photoirradiation controller 29 to thereby determine energy (step S143). Further, a secondary electron image 84 is acquired to thereby check whether or not a desired pattern contrast is obtained by making an image analysis.

If it is not possible to obtain a pattern contrast of a layer that need be inspected, adjustment is made by use of a condition-setting tool shown in FIG. 12. Data on each absorptivity (for example, data on wavelength-absorptivity relationship, shown in FIG. 9) is displayed on an absorptivity data display window 81, and a wavelength band for irradiation can be adjusted on the display window 81. At the time of preparing a recipe, in particular, it is important to correct variation in absorptivity, due to a difference in the film-forming method, and a difference in material between producers, and the fact that a wavelength band for irradiation can be easily determined from the data on each absorptivity will lead to shortening of recipe-preparation time. In case that the pattern contrast of the layer that need be inspected is insufficient, energy adjustment is executed. The energy adjustment is determined on the basis of an amount of static charge, and a pattern contrast, as described in the first embodiment. Energy of the light of the first wavelength band is set such that a potential will fall within an error range not more than 0.5 V from a set static potential. Energy of the light of the second wavelength band is set by adjusting energy while measuring a pattern contrast and determining that the pattern contrast is the highest, and at the maximum value.

In this connection, the pattern contrast need not necessarily be the highest, and setting may be made by determining that the pattern contrast is at a given value, or higher. Further, as described in the third embodiment, the energy of the light of the second wavelength band may be first adjusted depending on the layered structure of a specimen for inspection, or a defect as an inspection object. Results of the setting are displayed on a static charge amount data display window 82, and a pattern contrast data display window 83, respectively. By virtue of the static charge amount data display window, an amount of static charge in each layer can be grasped. Further, by virtue of the pattern contrast data display window, a contrast's dependence on the energy of light can be found, and further, it is possible to grasp whether or not a contrast at adjusted energy of the light is an appropriate contrast, and whether or not there exists energy of light, sufficient to enhance a contrast. Still further, with the aid of static charge amount data display, and pattern contrast data display, it is possible to check an increase in an irradiation energy amount, and deterioration of the light source or the optical system on the basis of an abnormal curve of characteristics. And an optical path undergoing deterioration can be identified depending on which of the static charge amount data, and the pattern contrast data has abnormality. A photoirradiation condition is displayed on a condition-result display window 85 to be incorporated in the inspection flow.

Further, the secondary electron image 84 is displayed in real time as the GUI. Accordingly, it is possible to grasp a state of a contrast in the secondary electron image 84, as the result of the photoirradiation condition. Further, the condition-result display window 85 is configured so as to enable an operator to input an optional numerical value, thereby controlling the photoirradiation system 9 according to the numerical value inputted. Further, the secondary electron image 84 under a condition as inputted can be displayed in real time, thereby executing adjustment of a contrast.

Herein, a specific example is described hereinafter. There is described the inspection of an opening deficiency, according to the second embodiment, by way of example. A mode for inspection of an opening deficiency of a wafer having a three-layer structure was selected on the window 79 for setting a defect type, and a three-layer structure including resist, BARC, and Si was selected on the window 80 for setting a layered structure. The GUI is configured such that a phenomenon induced by light on a layer-by-layer basis is automatically decided by setting of a defect type, and a layer, however, the sane can be changed on the part of the operator in the window 80 for setting a layered structure. Light of the first wavelength band (first light) selects a wavelength for emitting photo electrons from the resist (a wavelength to be absorbed by the resist), thereby causing the surface layer to be positively charged. In order to obtain a high pattern contrast, it is necessary to concurrently inhibit the static charge of a BARC layer, as described in the second embodiment. In order to inhibit the static charge of the BARC layer, there are conceivable two methods for using light of the second wavelength band (second light), that is, a method for causing photo electrons to be emitted from an Si layer by causing the light of the second wavelength band to be absorbed by the Si layer, thereby rendering the BARC layer negatively charged, and a method for causing the light of the second wavelength band to be absorbed by the BARC layer, thereby rendering BARC layer electrically conductive.

Accordingly, determination on which of the two methods is appropriate is made on the basis of absorptivity data to be displayed on the absorptivity data display window 81. The absorptivity data display window 81 is capable of calling up, and displaying the absorptivity data on every material-quality, and every manufacturing method, as registered, from the database. Results of measurements by the absorptivity meter 17, and the surface electrometer 18, respectively, on the basis of every material-quality, and every manufacturing method, and data disclosed by material producers are registered in the database. It is apparent from the absorptivity data that a wavelength for causing BARC electrically conductive has a high absorptivity in the resist, and therefore, there does not exist an appropriate wavelength insusceptible to absorption by the resist, and susceptible to absorption by BARC, so that it is determined that enhancement in contrast cannot be expected of a secondary electron image.

On the other hand, it can be determined from the absorptivity data displayed on the absorptivity data display window 81 that a wavelength of light transmitting through the resist and BARC to be absorbed by Si, thereby causing photo electrons to be emitted from Si, has a low absorptivity in the resist, and BARC, so that the wavelength can effectively inhibit static charging of BARC. Accordingly, for the light of the second wavelength band, selection was made of the wavelength transmitting through the resist and BARC to be absorbed by Si, thereby causing photo electrons to be emitted from Si. The wavelength band of the first light, and the wavelength band of the second light are automatically extracted from the database on absorptivity. The first light turned out light of a wavelength band in a wavelength range of 160 to 180 nm, and the second light turned out light of a wavelength band in a wavelength range of 240 to 300 nm With the adoption of the method described as above, it has become possible to determine the best irradiation condition for enhancement of the defect contrast in a wafer having a multilayer structure on the basis of the database, thereby realizing the enhancement of the defect contrast. As a result, this method can now contribute to yield management, and early detection of deficiency, in a semiconductor manufacturing process.

The first to fourth embodiments are described in the foregoing. With the invention, various phenomena such as positive static charging, negative static charging, and conduction can be induced on a layer-by-layer basis by selecting a plurality of wavelength bands of light for irradiation. The wavelength bands need be selected from among an ultraviolet region in a wavelength range of 100 to 400 nm, absorbed by $SiO_2$ and Si, a visible light region in a wavelength range of 400 to 700 nm, transmitting through $SiO_2$ and a near infrared region in a wavelength range of 700 to 1100 nm, transmitting through Si. Because an optimum electric field intensity distribution can be created by a combination of the induced phenomena, it is possible to control the pattern contrast according to a layer from which a defect need be extracted, or the type of a defect to be detected.

Further, there has existed a problem that selection of the photoirradiation condition has been difficult because absorptivity varies according to the quality of respective constituent materials of the layers of a wafer, and the film-forming method. Accordingly, a means for measuring the absorptivity of each of the layers, and a means for measuring an amount of static charge caused by photoirradiation are provided. According to the results of measurement on absorptivity, made on a wavelength-by-wavelength basis, for every layer, a wavelength band adopted for irradiation can be selected. Further, the irradiation energy can be controlled according to the results of measurement made on the amount of the static charge at a photoirradiation unit, so that it has become possible to enhance stability and reproducibility of the pattern contrast.

The invention claimed is:

1. A charged particle beam apparatus comprising:
   a charged particle gun;
   a specimen holder with a specimen placed thereon;
   a charged particle optical system that irradiates the specimen placed on the specimen holder with charged particle beams radiated from the charged particle gun;
   a detector that detects secondary electrons generated by irradiation of the specimen with the charged particle beams;
   an image processing unit that executes image processing of signals of the secondary electrons detected by the detector; and
   a photoirradiation system capable of simultaneously irradiating an identical region of the specimen placed on the specimen holder with light of a first wavelength band, and light of a second wavelength band, differing in wavelength band from each other,
   wherein the photoirradiation system comprises a beam splitter for integrating respective optical paths of the light of the first wavelength band, and the light of the second wavelength band.

2. The charged particle beam apparatus according to claim 1, wherein a combination of the first wavelength band and the second wavelength band can be changed.

3. The charged particle beam apparatus according to claim 1, wherein the light of the first wavelength band, and the light of the second wavelength band are lights having an output not less than 1/e of the peak output, respectively, not overlapping each other.

4. The charged particle beam apparatus according to claim 3, wherein the light of the first wavelength band, and the light of the second wavelength band are lights of wavelength bands in a range of 133 to 180 nm, and in a range of 200 to 266 nm, respectively.

5. The charged particle beam apparatus according to claim 1, wherein the photoirradiation system comprises a light source, a first beam splitter for splitting an optical path of light emitted from the light source, filters provided in respective optical paths of the light, split by the first beam splitter, for changing a wavelength band, and a second beam splitter for integrating the respective optical paths of the light into one optical path, the light of the first wavelength band, and the light of the second wavelength band making up light irradiated from the second beam splitter.

6. The charged particle beam apparatus according to claim 5, wherein filters for adjusting output energy of light, and shutters for shielding light, respectively, are provided in the respective optical paths of the light between the light of the first wavelength band, and the light of the second wavelength band.

7. The charged particle beam apparatus according to claim 1, further comprising an absorptivity meter for measuring light absorptivity at a predetermined layer of the specimen with the use of light irradiated from the photoirradiation system.

8. The charged particle beam apparatus according to claim 1, further comprising a display device for inputting information on constituent layers of the specimen, and a photoirradiation controller for controlling a combination of the first wavelength band and the second wavelength band, wherein the photoirradiation controller controls the photoirradiation system such that the first wavelength band is desirably combined with the second wavelength band on the basis of the information on the constituent layers, inputted by the display device.

9. The charged particle beam apparatus according to claim 8, further comprising a database for accumulating information on material of a predetermined layer, and absorptivity of a wavelength of light, wherein control of the photoirradiation system is executed on the basis of the information accumulated in the database.

10. The charged particle beam apparatus according to claim 1, wherein either the light of the first wavelength band, or the light of the second wavelength band is light causing a predetermined layer of the specimen to be negatively charged.

11. A charged particle beam apparatus comprising:
a charged particle gun;
a specimen holder with a specimen placed thereon;
a charged particle optical system that irradiates the specimen placed on the specimen holder with charged particle beams radiated from the charged particle gun;
a detector that detects secondary electrons generated by irradiation of the specimen with the charged particle beams;
an image processing unit that executes image processing of signals of the secondary electrons detected by the detector; and
a photoirradiation system that irradiates the specimen placed on the specimen holder with light,
wherein the photoirradiation system includes a beam splitter for integrating respective optical paths of light of a first wavelength band, and light of a second wavelength band, differing in wavelength band from each other.

12. The charged particle beam apparatus according to claim 11, wherein the photoirradiation system comprises a light source, a second beam splitter differing from the beam splitter, for splitting an optical path of light emitted from the light source, filters provided in respective optical paths of the light, split by the second beam splitter, for changing respective wavelength bands, the photoirradiation system integrating the light of the first wavelength band, and the light of the second wavelength band before irradiating the specimen with light.

13. The charged particle beam apparatus according to claim 12, wherein a filter for adjusting output energy of light, and a shutter for shielding light are provided in respective optical paths of the light of the first wavelength band, and the light of the second wavelength band between the beam splitter and the second beam splitter.

14. The charged particle beam apparatus according to claim 11, wherein the light of the first wavelength band, and the light of the second wavelength band are lights having an output not less than 1/e of the peak output, respectively, not overlapping each other.

15. The charged particle beam apparatus according to claim 11, wherein either the light of the first wavelength band, and the light of the second wavelength band is light causing a predetermined layer of the specimen to be negatively charged.

16. A charged particle beam apparatus for inspection of a specimen having a structure comprised of third, second, and first layers that are stacked on top of each other in orderly sequence, said charged particle beam apparatus including:
a charged particle gun;
a specimen holder with the specimen placed thereon;
a photoirradiation system that simultaneously irradiates light of a first wavelength band to be absorbed by the first layer, and light of a second wavelength band transmitting through the first layer, and the second layer to be absorbed by the third layer;
a charged particle optical system that causes the first layer positively charged due to irradiation with the light of the first wavelength band, and the second layer negatively charged by the agency of photo electrons, the photo electrons being generated in the third layer due to irradiation thereof with the light of the second wavelength band, to be irradiated with charged particle beams radiated from the charged particle gun;
a detector that detects secondary electrons generated by irradiation of the first layer and the second layer with the charged particle beams; and
an image processing unit that executes image processing of signals of the secondary electrons detected by the detector.

17. The charged particle beam apparatus according to claim 16, further comprising a display device for inputting respective constituent materials of the first to the third layers, and a photoirradiation controller for controlling a combination of the first wavelength band and the second wavelength band, wherein the photoirradiation controller controls the photoirradiation system such that the first wavelength band is desirably combined with the second wavelength band on the basis of the information on the constituent materials, inputted by the display device.

18. The charged particle beam apparatus according to claim 16, wherein a defect inspection is performed according to an image obtained by image processing executed by the image processing unit.

19. The charged particle beam apparatus according to claim 16, wherein the light of the first wavelength band, and the light of the second wavelength band are lights having an output not less than 1/e of the peak output, respectively, not overlapping each other.

* * * * *